United States Patent
Yamaguchi et al.

(10) Patent No.: US 7,785,500 B2
(45) Date of Patent: Aug. 31, 2010

(54) ELECTRICALLY CONDUCTIVE ADHESIVE

(75) Inventors: Atsushi Yamaguchi, Osaka (JP);
Hidenori Miyakawa, Osaka (JP);
Takayuki Higuchi, Osaka (JP); Koso Matsuno, Osaka (JP); Hideyuki Tsujimura, Kyoto (JP)

(73) Assignee: Panasonic Corporation, Osaka (JP)

( * ) Notice: Subject to any disclaimer, the term of this patent is extended or adjusted under 35 U.S.C. 154(b) by 9 days.

(21) Appl. No.: 12/092,453

(22) PCT Filed: Oct. 31, 2006

(86) PCT No.: PCT/JP2006/321753

§ 371 (c)(1),
(2), (4) Date: May 2, 2008

(87) PCT Pub. No.: WO2007/052661

PCT Pub. Date: May 10, 2007

(65) Prior Publication Data

US 2009/0114885 A1 May 7, 2009

(30) Foreign Application Priority Data

Nov. 2, 2005 (JP) ............................. 2005-319489

(51) Int. Cl.
*H01B 1/22* (2006.01)
*C09J 9/02* (2006.01)

(52) U.S. Cl. ...................................... 252/514; 156/327

(58) Field of Classification Search ................ 252/514; 106/1.21; 156/327
See application file for complete search history.

(56) References Cited

U.S. PATENT DOCUMENTS 5,428,249 A * 6/1995 Sawayama et al. .......... 257/746
7,417,195 B2 * 8/2008 Totani et al. ................ 174/255
2005/0230667 A1 * 10/2005 Komagata et al. ........... 252/500
2006/0289839 A1 * 12/2006 Emmerson et al. .......... 252/500

FOREIGN PATENT DOCUMENTS

| JP | 10-163605 | 6/1998 |
|---|---|---|
| JP | 10-279902 | * 10/1998 |
| JP | 3027441 | 1/2000 |
| JP | 2001-294844 | 10/2001 |
| JP | 2002-265920 | 9/2002 |
| JP | 2005-194306 | 7/2005 |
| JP | 2006-294600 | 10/2006 |

OTHER PUBLICATIONS

Machine translation of JP 2001-294844A.*
International Search Report issued Feb. 6, 2007 in the International (PCT) Application PCT/JP2006/321753 of which the present application is the U.S. National Stage.

* cited by examiner

*Primary Examiner*—Mark Kopec
(74) *Attorney, Agent, or Firm*—Wenderoth, Lind & Ponack, L.L.P.

(57) ABSTRACT

The present invention provides an electrically conductive adhesive which prevents migration and sulfuration of a metal component in electronic component mounting. The electrically conductive adhesive includes a thermosetting resin and metal filler particles dispersed in the thermosetting resin. It is possible to use, as the metal filler particles, metal filler particles having a composition including an alloy of Ag with at least one metal selected from the group consisting of Sn, Cu, In, Bi and Ni, a mixture of such metal filler particles and Ag filler particles, and metal filler particles including Ag filler particles and a coating layer formed on the surface of the Ag filler particles using a metal such as Sn.

7 Claims, No Drawings

ELECTRICALLY CONDUCTIVE ADHESIVE

BACKGROUND OF THE INVENTION

1. Field of the Invention

The present invention relates to an electrically conductive adhesive used for mounting of electronic components and formation of wiring of an electronic circuit board.

2. Description of the Related Art

Heretofore, a Sn—Pb solder material, particularly a Snip eutectic solder material with a 63Sn-37Pb eutectic composition (composition of 63% by weight of Sn and 37% by weight of Pb) has conventionally been used as a bonding material for electronic component mounting.

However, in electronic component mounting, there has recently been required an improvement in the mechanical strength of the soldering portion and an improvement reliability of a thermal shock strength. While global environmental protection has become of major interest, regulation of treatment of industrial waste such as electronic circuit boards is becoming more severe and lead is becoming a global regulation subject.

Thus, in the bonding material, there is a tendency that the Sn—Pb solder material is replaced with a solder material containing no lead, a so-called lead-free solder material. Typical example of such a lead-free solder containing two kinds of metals as main components includes a Sn—Ag solder as a eutectic alloy material having excellent wettability (refer to Japanese Patent No. 3,027,441).

Since the melting point of the Sn—Ag solder is about 30 to 40° C. higher than the melting point of the Sn—Pb solder (about 183° C.), the soldering temperature in the case of using the Sn—Ag solder is higher than that in the case of using the Sn—Pb solder. Therefore, when the Sn—Ag solder is used, the mounting temperature in the case of mounting electronic components may become higher than the heat-resistant temperature of electronic components. In this case, there arises a problem that electronic components may be damaged.

As described above, since the melting point of the solder may exert an influence on the mounting temperature of the solder, a lead-free solder capable of lowering the melting point has been developed. Furthermore, an electrically conductive adhesive comprising a metal component of a lead-free solder and a resin component, particularly a thermosetting resin component has been developed. When using an electrically conductive adhesive in which both the melting point of the metal component and the curing temperature of the thermosetting resin component are comparatively low, damage caused by heat of the electronic component can be prevented or reduced upon mounting of electronic components. Thus, intense interest has been shown towards such an electrically conductive adhesive as a bonding material to replace the solder (refer to Japanese Unexamined Patent Publication (Kokai) No. 10-163605).

A general electrically conductive adhesive is formed by mixing filler particles of a metal component of a lead-free solder in either a bulk or flake form, with a thermosetting resin component in a predetermined ratio. When an electronic component is bonded with a circuit board using such an electrically conductive adhesive, volume resistivity may increase as compared with the case of bonding using a lead-free solder as a bulk metal or volume resistivity may sometimes vary even if an electrically conductive adhesive with the same composition is used. Therefore, use of the electrically conductive adhesive was restricted.

When electronic components are bonded using an electrically conductive adhesive containing Ag filler particles as a metal component, Ag filler particles may cause migration and/or sulfuration according to the environment using the electronic component.

In the case of the electrically conductive adhesive containing Ag filler particles as the metal component, Ag filler particles constitute a main electrically conductive component of the electrically conductive adhesive. Therefore, in either case when Ag filler particles cause migration or sulfuration, resistivity of the bonding portion or wiring formation portion increases. This causes a decrease in reliability of the electronic component with a lapse of time, thus leading to a short lifetime of the electronic component and electrical/electronic equipment using the electronic component. Therefore, it has been required to prevent migration and sulfuration of metal filler particles, particularly Ag filler particles.

SUMMARY OF THE INVENTION

An object of the present invention is to provide an electrically conductive adhesive comprising metal filler particles as a metal component and a thermosetting resin as a resin component, which can prevent occurrence of migration and sulfuration of Ag filler particles.

The first invention of the present application provides an electrically conductive adhesive comprising a metal filler particle component made of an alloy of Ag with at least one metal selected from the group consisting of Sn, Cu, In, Bi and Ni. In the first invention of the present application, an alloy composition of an Ag component as an essential component with at least one metal selected from the group consisting of Sn, Cu, In, Bi and Ni is used as the metal filler particle component. The metal filler particles preferably have an average particle diameter of 5 to 30 μm. The resin component preferably contains a thermosetting resin as a main component.

The second invention of the present application provides an electrically conductive adhesive comprising a metal filler particle component comprising a mixture of Ag filler particles with alloy filler particles of Ag with at least one metal selected from the group consisting of Sn, Cu, In, Bi and Ni, and a resin component. As the metal filler particle component of the second invention of the present application, for example, a mixture of Ag filler particles with the metal filler particles having the alloy composition, which can be used as the metal filler particle component of the first invention as mentioned in the above is used. The metal filler particles preferably have an average particle diameter of 5 to 30 μm. The resin component preferably contains a thermosetting resin as a main component.

With respect to the alloys of the first and second inventions of the present application, Bi and In are added for the purpose of lowering the melting point of the alloy. The content of Bi in the alloy is preferably within a range from 0.1 to 70% by weight, and more preferably from 10 to 60% by weight. When the content of Bi is less than 0.1% by weight, the effect of lowering the melting point can not be sufficiently obtained. In contrast, when the content of Bi is more than 70% by weight, the effect of further lowering the melting point can not be obtained. The content of In in the alloy is preferably within a range from 1.0 to 70% by weight, and more preferably from 2.0 to 60% by weight. When the content of In is less than 1.0% by weight, the effect of lowering the melting point can not be sufficiently obtained. In contrast, when the content is more than 70% by weight, the effect of further lowering the melting point can not be obtained.

The third invention of the present application provides an electrically conductive adhesive comprising a metal filler particle component comprising a mixture of Ag filler particles with metal filler particles made of at least one metal selected from the group consisting of Cu, Sn, Ni, Zn and Al, and a resin component. The metal filler particles preferably have an average particle diameter of 5 to 30 µm. The resin component preferably contains a thermosetting resin as a main component.

With respect to the alloys of the first to third inventions of the present application, Cu is added for the purpose of improving mechanical characteristics of the alloy. The content of Cu in the alloy is preferably within a range from 0.1 to 1.0% by weight, and more preferably from 0.2 to 0.9% by weight. When the content of Cu is less than 0.1% by weight, the effect of improving mechanical characteristics is not obtained. In contrast, when the content is more than 1.0% by weight, the alloy may become brittle and mechanical characteristics are adversely affected.

With respect to the alloys of the first to third inventions of the present application, Ni is added for the purpose of suppressing oxidation of Sn. The content of Ni in the alloy is preferably within a range from 0.01 to 1.0% by weight, and more preferably from 0.1 to 0.5% by weight. When the content of Ni is less than 0.1% by weight, the effect of suppressing oxidation of Sn is not obtained. In contrast, when the content is more than 1.0% by weight, a firm Ni oxide film is formed, and thus the melting point increases and the effect of suppressing oxidation of Sn is not obtained.

The fourth invention of the present application provides an electrically conductive adhesive comprising a metal filler particle component and a resin component, wherein the metal filler particle component comprises metal filler particles of Ag filler particles each provided with a coating layer of a Sn-containing metal formed on the surface of the Ag filler particles. In one aspect, the metal filler particles of the electrically conductive adhesive is subjected to a heat treatment, so that the metal in the coating layer can be alloyed with Ag at least in the surface region of the Ag filler particles, for example, by subjecting the metal filler particles to a heat treatment. In another aspect, a metal containing only Sn as the component thereof can be used as the Sn-containing metal. In still another aspect, an alloy of Sn with at least one metal selected from the group consisting of Cu, In, Bi, Ni and Ag can also be used as the Sn-containing metal. The coating layer can be formed on the surface of the Ag filler particles by a means such as plating. The metal filler particles preferably have an average particle diameter between 5 and 30 µm. The resin component preferably contains a thermosetting resin as a main component.

With respect the fourth invention of the present application, when the coating layer made of the alloy of Sn with at least one metal selected from the group consisting of Cu, In, Bi, Ni and Ag, or of Sn alone is subjected to a heat treatment, Ag is alloyed with the metal in the coating layer on at least the surface of Ag filler particles inside the coating layer. In such case, the portion where Ag is alloyed with the metal in the coating layer can exhibit a melting point which is much lower than that of Ag.

A common feature of the first to fourth inventions of the present application is that the content of Ag in the metal filler particle component is 50% by weight or more and thus the content of the metal(s) other than Ag is 50% by weight or less.

The fifth invention of the present application provides an electrically conductive adhesive comprising a metal filler particle component made of an alloy of Sn with at least one metal selected from the group consisting of Cu, In, Bi, Ni and Ag, and a resin component. In the present invention, metal filler particles having the alloy composition of Sn as an essential component and at least one metal selected from the group consisting of Cu, In, Bi, Ni and Ag is used as the metal filler particle component. In one modified aspect, a mixture of Sn filler particles and metal filler particles having the above alloy composition can be prepared and used as the metal filler particle component. The metal filler particles preferably have an average particle diameter between 5 and 30 µm. The resin component preferably contains a thermosetting resin as a main component.

With respect to the fifth invention of the present application, it is possible to improve wettability of the metal filler particles and to lower the melting point by adding Bi. When the content of Bi is less than 0.1% by weight, the effect of improving wettability cannot be obtained. In contrast, when the content is more than 60% by weight, the effect of improving wettability and lowering the melting point is not obtained. Therefore, the content of Bi is preferably within a range from 0.1 to 60% by weight.

With respect to the fifth invention of the present application, lowering the melting point of the metal filler particles can be carried out by adding In. When the content of In is less than 1% by weight, sufficient effect of lowering the melting point is not obtained. In contrast, even when the content is more than 60% by weight, the effect of further lowering the melting point is not obtained. Therefore, the content of In is preferably within a range from 1 to 60% by weight.

With respect to the fifth invention of the present application, mechanical characteristics of the alloy can be improved by adding Cu and Ag. When the content of Cu is less than 0.1% by weight, the effect on mechanical characteristics is not obtained. Therefore, the content of Cu is preferably 0.1% by weight or more. The content of Cu is more preferably within a range from 0.5 to 0.7% by weight.

With respect to the fifth invention of the present application, when the content of Ag is less than 0.1% by weight, the effect on mechanical characteristics is not obtained. In contrast, when the content is more than 5% by weight, the melting point quickly increases. Therefore, the content of Ag is within a range from 0.1 to 5% by weight.

With respect to the fifth invention of the present application, oxidation of Sn can be suppressed by adding Ni. When the content of Ni is less than 0.01% by weight, the effect of suppressing oxidation of Sn is not obtained. In contrast, when the content is more than 1.0% by weight, a firm Ni oxide film is formed and the melting point increases, and thus the effect is not obtained. Therefore, the content of Ni is preferably within a range from 0.01 to 1.0% by weight.

A common feature of the first to fifth inventions of the present application is that, since the metal belonging to the group of Cu, Sn, Ni, Zn and Al has a larger ionization tendency than that of Ag, ionization of Ag can be effectively suppressed by allowing Ag to coexist with these metals. Embodiments of such coexistence includes a form of mixing Ag particles with metal particles of at least one or more kinds of the group of Cu, Sn, Ni, Zn and Al, and a form of alloying Ag with one or more metals of the group of Cu, Sn, Ni, Zn and Al. By allowing an alloy of one or more kinds of metals of the group of Cu, Sn, Ni, Zn and Al to exist with Ag, the effect of suppressing migration and the effect of suppressing sulfuration are exerted. When at least 0.1% by weight of one or more kinds of alloys of the group of Cu, Sn, Ni, Zn and Al is added to Ag, the effect of suppressing migration and sulfuration of Ag is exerted.

The sixth invention of the present application is characterized in that a hardening agent for a thermosetting resin used in a first component in a resin component contains a complex of a metal selected from the group consisting of Cu, Sn, Ni, Zn and Al in the electrically conductive adhesives according to the first to fifth inventions. Since the metal belonging to the group of Cu, Sn, Ni, Zn and Al has a larger ionization tendency than that of Ag, ionization of Ag can be effectively suppressed by allowing these metals coexist with Ag.

In the electrically conductive adhesives according to the first to fifth inventions of the present application, the effect of suppressing migration of Ag can also be exerted by adding an organic compound or metal complex containing metals having a larger ionization tendency than that of Ag, such as Cu, Sn, Ni, Zn and Al, in the resin component.

In common with the respective inventions of the present application, it is possible to use, as the resin component of the electrically conductive adhesive, various thermosetting resins which are known to those skilled in the art. In the present invention, an epoxy-based resin, an acrylic resin, a phenolic resin, a polyimide-based resin, a thermosetting polyurethane resin and an unsaturated polyester resin can be used as the thermosetting resin, and the thermosetting resin is preferably an epoxy-based resin. Various one-pack type and two-pack type epoxy-based resins can be used, and a one-pack type epoxy-based resin is preferred. When the thermosetting resin is used, a curable resin system known to those skilled in the art (a system containing a specific curable resin and a specific kind of hardening agent required for curing) is usually used after mixing with the resin component.

Furthermore, when the resin component contains a resin having reducing properties, the electrically conductive adhesive composition can be maintained in a reducing atmosphere to some extent during the thermosetting process. Thus, formation of an oxide film on the surface of metal filler particles during the thermosetting process can be prevented. By preventing oxidation of the surface of metal filler particles during the thermosetting process, poor melting of the low melting point metal component and formation of an oxide film on the surface of Ag filler particles during the thermosetting process can be prevented.

In one aspect, the resin having reducing properties preferably contains a compound having a carboxyl group, for example, carboxylic acid. By adding such a compound in the resin, it is possible to remove an oxide film of a low melting point metal (to prevent formation of an oxide film on the surface of a low melting point metal) and to exert the action as a reducing agent for promoting melting. As the compound, various carboxylic acids such as an aliphatic carboxylic acid, an aromatic carboxylic acid and an alicyclic carboxylic acid can be used. Examples of the compound include adipic acid, abietic acid, ascorbic acid, acrylic acid, citric acid, polyacrylic acid, malic acid, pimelic acid, palmitic acid, myristic acid, lauric acid, sebacic acid, suberic acid, maleic acid, succinic acid, azelaic acid, fumaric acid, glutaric acid and malonic acid. The carboxylic acid is preferably in the form of a salt of metals such as Na, Ag, Cu and K.

When the resin component comprises a first resin component and a second resin component, the weight ratio of the first resin component to the second resin component is preferably within a range from 90:10 to 10:90, and particularly from 50:50 to 80:20. The proportion of the second resin component is preferably 20% by weight or less based on the metal filler particle component. When the proportion is more than 20% by weight, no further effect of the reducing agent and/or the hardening agent is exerted. When the second resin component acts as the hardening agent, the amount of the hardening agent used as the first resin component can be decreased.

Since the metal filler particle component of the electrically conductive adhesive of the first invention of the present application is made of an alloy of Ag with at least one metal selected from the group consisting of Sn, Cu, In, Bi and Ni, the Ag component constitutes a portion of the alloy composition. Therefore, migration and sulfuration of Ag filler particles can be effectively prevented when this electrically conductive adhesive is used for bonding two contact points.

With respect to the electrically conductive adhesive of the second invention of the present application, since the Ag component constitutes a portion of the alloy composition in metal filler particles made of an alloy of Ag with at least one metal selected from the group consisting of Sn, Cu, In, Bi and Ni, migration of Ag filler particles from the metal filler particles or sulfuration of Ag filler particles can be effectively prevented when this electrically conductive adhesive is used for bonding two contact points. Furthermore, this alloy has a much lower melting point than that of Ag. When this electrically conductive adhesive containing a mixture of metal filler particles made of an alloy and Ag filler particles as a metal filler particle component is applied and heated, the metal filler particles having the alloy composition are melted and the melt flows in the resin component maintaining a flow state. The melt surrounds the Ag filler particles or communicates and integrates with the Ag filler particles to substantially form a metal-to-metal joint or metal bond in the resin component, and thus a conduction path can be formed. Thereafter, the thermosetting resin sets to obtain a conduction path formed by integration and mutual communication of filler particles in the thermosetting resin. It is considered that, since at least the surface of Ag filler particles is surrounded by the alloy, migration and sulfuration of Ag filler particles can be effectively prevented after the application.

In the electrically conductive adhesive of the third invention of the present application, metal filler particles comprising Ag filler particles and at least one metal filler particles of metals selected from the group consisting of Cu, Sn, Ni, Zn and Al are used. Since the metals other than Ag in the metal filler particles have a comparatively low melting point and have a larger ionization tendency than that of Ag, migration and/or sulfuration of Ag filler particles can be effectively prevented when this electrically conductive adhesive is used to bond two contact points.

In the electrically conductive adhesive of the fourth invention of the present application, metal filler particles consisting essentially of Ag filler particles each having a coating layer of a Sn-containing metal formed on the surface of the Ag filler particles are used. Since each of the metal filler particles has a coating layer of a metal having a larger ionization tendency than that of Ag, such as Sn as the main component thereof, migration and sulfuration of Ag filler particles can be effectively prevented. Furthermore, the metal filler particles are subjected to a heat treatment to form at least an Ag—Sn alloy on the surface (namely, an interface between Ag filler particles and a coating layer of a Sn-containing metal) of the Ag filler particles, and the alloy can sometimes contain other metals in the composition. Sn has a larger ionization tendency than Ag and the alloy can have a comparatively low melting point. Therefore, when this electrically conductive adhesive is used to bond two contact points, migration and sulfuration of Ag filler particles can be effectively prevented.

In the electrically conductive adhesive of the fifth invention of the present application, metal filler particles with the alloy composition containing Sn as the essential component thereof and having a comparatively low melting point are used. When this electrically conductive adhesive is applied and heated, each of the metal filler particles comes to contact with each other, thereby a conductive path is formed. In addition, at least the surface portion, preferably the entire portion of the metal filler particles are melted and metal components of the metal filler particles in a molten state are integrated and communicated in the resin component maintaining a flow state to substantially form a metal-to-metal joint or metal bond. Then, the thermosetting resin is cured to obtain a conduction path formed by integration and mutual communication of filler particles in the thermosetting resin.

The electrically conductive adhesive of the sixth invention of the present application is characterized in that a hardening agent for a thermosetting resin used as a first component in a resin component contains a complex of a metal selected from the group consisting of Cu, Sn, Ni, Zn and Al in the electrically conductive adhesive according to the first to fifth inventions. Since the metal selected from the group consisting of Cu, Sn, Ni, Zn and Al has a larger ionization tendency than that of Ag, ionization of Ag can be effectively suppressed by allowing these metals to exist together with Ag.

The electrically conductive adhesive of the present invention can be used for mounting of electronic components or formation of wiring. The electrically conductive adhesive can be used for connection of electronic components such as CCD elements, holographic elements and chip components, and formation of wiring of a substrate to which these electronic components are bonded. The electronic components and substrate thus formed can be used in various electric appliances such as DVDs, cellular phones, portable AV equipment, laptop PCs and digital cameras.

DETAILED DESCRIPTION OF THE INVENTION

Embodiment 1

According to the composition of each example shown in Table 1, an alloy of Ag with a metal other than Ag was prepared and then granulated to obtain metal filler particles having an average particle diameter of about 5 μm. 80 parts by weight of the metal filler particles were added to 20 parts by weight of a thermosetting epoxy resin to obtain an electrically conductive adhesive of the first invention of the present application. Examples of an epoxy resin, which is preferably used in the invention of the present invention, include Epicoat 828 and Epicoat 807 (manufactured by Japan Epoxy Resin (JER) Co., Ltd.). In this embodiment, Epicoat 828 (manufactured by Japan Epoxy Resin (JER) Co., Ltd.) was used as a thermosetting epoxy resin and 2PHZ (manufactured by SHIKOKU CHEMICALS CORPORATION) was used as a hardening agent.

With respect to each example, the example in which the symbol "-a" is provided behind the number of the example is an example in which a coating layer of a Sn-containing metal is formed on the surface of Ag filler particles in the stage of preparing metal filler particles. The example in which the symbol "-b" is provided behind the number of the example is an example in which a coating layer of a Sn-containing metal is formed and then subjected to a heat treatment in the stage of preparing metal filler particles.

The electrically conductive adhesive of each example was printed on a comb-shaped electrode such as indicated in JIS Z 3197 and then hardened at a temperature of 150° C. for 10 minutes. Direct-Current voltage (DC) of 45 to 50 V was applied between electrodes and left in a thermo-hygrostat chamber at 85° C.-85% for 1,000 hours. Then, each sample was examined whether or not migration of Ag had been occurred in the bonding portion. The occurrence of migration of Ag was visually observed with a magnifying glass (magnification of 20 times or higher). The case where there was formation of a dendritic metal between one electrode and the other electrode was regarded as occurrence of migration.

The results of the metal filler particle component (% by weight) used and occurrence of migration are shown in Table 1.

TABLE 1

|  | Ag | Sn | Cu | In | Bi | Ni | Generation of migration |
|---|---|---|---|---|---|---|---|
| Example 1-a | 99.5 | 0.5 |  |  |  |  | Good |
| Example 1-b | 99.5 | 0.5 |  |  |  |  | Good |
| Example 2-a | 99.5 |  | 0.5 |  |  |  | Good |
| Example 2-b | 99.5 |  | 0.5 |  |  |  | Good |
| Example 3-a | 99.5 |  |  | 0.5 |  |  | Good |
| Example 3-b | 99.5 |  |  | 0.5 |  |  | Good |
| Example 4-a | 99.5 |  |  |  | 0.5 |  | Good |
| Example 4-b | 99.5 |  |  |  | 0.5 |  | Good |
| Example 5-a | 99.5 |  |  |  |  | 0.5 | Good |
| Example 5-b | 99.5 |  |  |  |  | 0.5 | Good |
| Example 6-a | 50 | 50 |  |  |  |  | Good |
| Example 6-b | 50 | 50 |  |  |  |  | Good |
| Example 7-a | 99 |  | 1 |  |  |  | Good |
| Example 7-b | 99 |  | 1 |  |  |  | Good |
| Example 8-a | 95 |  |  | 5 |  |  | Good |
| Example 8-b | 95 |  |  | 5 |  |  | Good |
| Example 9-a | 95 |  |  |  | 5 |  | Good |
| Example 9-b | 95 |  |  |  | 5 |  | Good |
| Example 10-a | 99.9 |  |  |  |  | 0.1 | Good |
| Example 10-b | 99.9 |  |  |  |  | 0.1 | Good |
| Comparative Example 1 | 100 |  |  |  |  |  | Poor |

Evaluation of occurrence of Migration
Good: No migration occurred
Poor: Migration occurred The method for evaluation of occurrence of migration is applied to all embodiments described below.

Embodiment 2

According to the composition of each example shown in Table 2, an alloy of Sn with one or more metal(s) other than Sn was prepared and then granulated to obtain alloy filler particles having an average particle diameter of about 5 μm. 80 parts by weight of the alloy filler particles were added to 20 parts by weight of a thermosetting epoxy resin to obtain an electrically conductive adhesive of the fifth invention of the present application. Epicoat 828 (manufactured by Japan Epoxy Resin (JER) Co., Ltd.) was used as a thermosetting epoxy resin and 2PHZ (manufactured by SHIKOKU CHEMICALS CORPORATION) was used as a hardening agent.

In the same manner as in Embodiment 1, it was examined whether or not migration of Sn occurs using the electrically conductive adhesive of each example. The results of the metal filler particle component (% by weight) used and occurrence of migration are shown in Table 2.

TABLE 2

|  | Sn | Bi | In | Cu | Ag | Ni | Melting point (° C.) | Generation of migration |
|---|---|---|---|---|---|---|---|---|
| Example 11 | 43 | 57 |  |  |  |  | 139 | Good |
| Example 12 | 48 |  | 52 |  |  |  | 120 | Good |
| Example 13 | 42 | 57 |  |  | 1 |  | 145 | Good |
| Example 14 | 42.5 | 57 |  | 0.5 |  |  | 140 | Good |
| Example 15 | 47.95 |  | 52 |  |  | 0.05 | 118 | Good |
| Example 16 | 41 | 57 |  |  | 2 |  | 141 | Good |
| Example 17 | 92 |  | 5 |  | 3 |  | 210 | Good |
| Example 18 | 87 |  | 10 |  | 3 |  | 200 | Good |
| Example 19 | 93.5 | 0.5 | 3 |  | 3 |  | 214 | Good |
| Example 20 | 91.5 | 0.5 | 5 |  | 3 |  | 212 | Good |

TABLE 2-continued

| | Sn | Bi | In | Cu | Ag | Ni | Melting point (° C.) | Generation of migration |
|---|---|---|---|---|---|---|---|---|
| Example 21 | 88.5 | 0.5 | 8 | | 3 | | 206 | Good |
| Example 22 | 86.5 | 0.5 | 10 | | 3 | | 202 | Good |
| Example 23 | 42.95 | 57 | | | | 0.05 | 140 | Good |
| Example 24 | 99.3 | | | 0.7 | | | 227 | Good |
| Example 25 | 96.5 | | | | 3.5 | | 221 | Good |
| Example 26 | 96.5 | | | 0.5 | 3 | | 119 | Good |
| Comparative Example 2 | | | | | 100 | | 960 | Poor |

Embodiment 3

Using a metal having the composition of each example shown in Table 3, a metal coating layer was formed on the surface of Ag filler particles having an average particle diameter of about 5 μm by a plating method. The coated filler particles were subjected to a heat treatment at a temperature which is about 20° C. higher than the melting point of the metal composition of each example (a temperature of the melting point+about 20° C.), thereby alloying Ag with a metal component of the coating layer on at least the surface of Ag filler particles of each metal filler particles to obtain a metal filler particle component of the fourth invention of the present application. Ag and the metal of the coating layer were used in a weight ratio of 10:1. 80 parts by weight of the metal filler particle component thus obtained was added to 20 parts by weight of a thermosetting epoxy resin to obtain an electrically conductive adhesive of the fourth invention of the present application. Epicoat 828 (manufactured by Japan Epoxy Resin (JER) Co., Ltd.) was used as a thermosetting epoxy resin and 2PHZ (manufactured by SHIKOKU CHEMICALS CORPORATION) was used as a hardening agent.

In the same manner as in Embodiment 1, it was examined whether or not migration of Ag occurs using the electrically conductive adhesive of each example. The results of the metal filler particle component (% by weight) used and occurrence of migration are shown in Table 2.

TABLE 3

| | Sn | Bi | Cu | Ag | Generation of migration |
|---|---|---|---|---|---|
| Example 27 | 97 | 3 | | | Good |
| Example 28 | 99.3 | | 0.7 | | Good |
| Example 29 | 96.5 | | | 3.5 | Good |
| Comparative Example 3 | | | | 100 | Poor |

Embodiment 4

Metal filler particles made of metals having the composition of each example shown in Table 1 (excluding Ag), and having an average particle diameter of about 5 μm, were produced, and then mixed with Ag filler particles having an average particle diameter of about 5 μm to obtain a metal filler particle component of the third invention of the present application. Metal filler particles and Ag filler particles were used in a weight ratio of 1:10. 80 parts by weight of the metal filler particle component thus obtained were added to 20 parts by weight of a thermosetting epoxy resin to obtain an electrically conductive adhesive of the third invention of the present application. Epicoat 828 (manufactured by Japan Epoxy Resin (JER) Co., Ltd.) was used as the thermosetting epoxy resin and 2PHZ (manufactured by SHIKOKU CHEMICALS CORPORATION) was used as a hardening agent.

In the same manner as in Embodiment 1, it was examined whether or not migration of Ag occurs using the electrically conductive adhesive of each example. The results of the metal filler particle component (% by weight) used and occurrence of migration are shown in Table 2.

Embodiment 5

According to the composition of each example shown in Table 4, an alloy of Sn and a metal or metals other than Sn was prepared and then granulated to obtain alloy filler particles having an average particle diameter of about 5 μm. Separately, Sn filler particles having an average particle diameter of about 5 μm were supplied. Then the above alloy filler particles and the Sn filler particles were mixed in a weight ratio of 1:10 to obtain metal filler particles being modified from the fifth invention of the present application. 80 parts by weight of the alloy filler particles thus obtained were added to 20 parts by weight of a thermosetting epoxy resin to obtain an electrically conductive adhesive of the fifth invention of the present application. Epicoat 828 (manufactured by Japan Epoxy Resin (JER) Co., Ltd.) was used as a thermosetting epoxy resin and 2PHZ (manufactured by SHIKOKU CHEMICALS CORPORATION) was used as a hardening agent.

Using the electrically conductive adhesive of each example, an IC chip was bonded to a circuit board. In the same manner as in Embodiment 1, it was examined whether or not migration of Ag occurs during a treatment of the resulting circuit board or in the bonding portion. The results of the metal filler particle component (% by weight) used and occurrence of migration are shown in Table 4.

TABLE 4

| | Sn | Bi | In | Cu | Ag | Ni | Melting point (° C.) | Generation of migration |
|---|---|---|---|---|---|---|---|---|
| Example 30 | 43 | 57 | | | | | 139 | Good |
| Example 31 | 48 | | 52 | | | | 120 | Good |
| Example 32 | 42 | 57 | | | 1 | | 145 | Good |
| Example 33 | 42.5 | 57 | | 0.5 | | | 140 | Good |
| Example 34 | 47.95 | | 52 | | | 0.05 | 118 | Good |
| Example 35 | 41 | 57 | | | 2 | | 141 | Good |
| Example 36 | 92 | | 5 | | 3 | | 210 | Good |
| Example 37 | 87 | | 10 | | 3 | | 200 | Good |
| Example 38 | 93.5 | 0.5 | 3 | | 3 | | 214 | Good |
| Example 39 | 91.5 | 0.5 | 5 | | 3 | | 212 | Good |
| Example 40 | 88.5 | 0.5 | 8 | | 3 | | 206 | Good |
| Example 41 | 86.5 | 0.5 | 10 | | 3 | | 202 | Good |
| Example 42 | 42.95 | 57 | | | | 0.05 | 140 | Good |
| Example 43 | 99.3 | | | 0.7 | | | 227 | Good |
| Example 44 | 96.5 | | | | 3.5 | | 221 | Good |
| Example 45 | 96.5 | | | 0.5 | 3 | | 119 | Good |
| Comparative Example 4 | | | | | 100 | | 960 | Poor |

Embodiment 6

In this embodiment, it was confirmed that the effect of suppressing migration of Ag is further obtained when a hardening agent containing a metal complex of a metal selected from the group consisting of Cu, Sn, Ni, Zn and Al is used as a hardening agent for a thermosetting resin. A resin component was prepared in the following manner. Epicoat 828 (manufactured by Japan Epoxy Resin (JER) Co., Ltd.) was used as a thermosetting resin. As a hardening agent, a hardening agent containing a metal complex (a metal salt of adipic acid) of Cu, Sn, Ni, Zn or Al, as shown in Table 4, was used. The weight ratio of the hardening agent to the thermosetting resin was 20:80.

Using the electrically conductive adhesive of each example, it was examined whether or not migration of Ag occurs in the bonding portion in the same manner as in Embodiment 1. Ag was used as a metal component, Epicoat 828 (manufactured by Japan Epoxy Resin (JER) Co., Ltd.) was used as a thermosetting epoxy resin, and 2PHZ (manufactured by SHIKOKU CHEMICALS CORPORATION) was used as a hardening agent. The results of the composition of the electrically conductive adhesive used and occurrence of migration are shown in Table 4. According to this embodiment, not only occurrence of migration could be suppressed, but also curing characteristics and properties relating to curing time were improved.

TABLE 5

Ag filler-containing electrically conductive adhesive

|  | Hardening agent | Migration |
| --- | --- | --- |
| Example 46 | Cu complex | Not occurred |
| Example 47 | Sn complex | Not occurred |
| Example 48 | Ni complex | Not occurred |
| Example 49 | Zn complex | Not occurred |
| Example 50 | Al complex | Not occurred |
| Comparative Example 5 | No metal complex | Not occurred |

In the electrically conductive adhesive of the present invention, by allowing filler particles to contain a low melting point metal, low melting point metal filler particles are melted in a thermosetting process of the electrically conductive adhesive to form a metal-to-metal joint among filler particles and to form a conduction path, thereby making it possible to realize stable volume resistivity equivalent to that of a bulk metal. When the electrically conductive adhesive having a setting temperature which is comparatively lower than a melting point of a lead-free solder being used is used for soldering, thermal damage of electronic components is reduced. Therefore, the electrically conductive adhesive of the present invention is useful as a material to replace solder in mounting of electronic equipment.

The invention claimed is:

1. An electrically conductive adhesive comprising a metal filler particle component, a resin component and a hardening agent, wherein the metal filler particle component comprises metal filler particles of Ag filler particles each provided with a coating layer of Sn-containing metal, and wherein an alloy layer of Ag with the Sn-containing metal is formed at least in the surface region of the Ag filler particles by subjecting the metal filler particles to a heat treatment, and wherein the hardening agent contains a metal complex compound, and wherein the resin component contains a carboxylic acid.

2. The electrically conductive adhesive according to claim 1, wherein the Sn-containing metal is an alloy of Sn with at least one metal selected from the group consisting of Cu, In, Bi, Ni and Ag.

3. The electrically conductive adhesive according to claim 1, wherein the Sn-containing metal has an Sn content of 96.5% by weight or more.

4. The electrically conductive adhesive according to claim 1, wherein the temperature of the heat treatment is above the melting point of the Sn-containing metal.

5. The electrically conductive adhesive according to claim 1, wherein the metal complex compound is a metal salt of an adipic acid.

6. The electrically conductive adhesive according to claim 5, wherein the metal of the metal salt is at least one metal selected from the group consisting of Cu, Sn, Ni, Zn and Al.

7. The electrically conductive adhesive according to claim 1, wherein the carboxylic acid is selected from the group consisting of adipic acid, abietic acid, ascorbic acid, acrylic acid, citric acid, polyacrylic acid, malic acid, pimelic acid, palmitic acid, myristic acid, lauric acid, sebacic acid, suberic acid, maleic acid, succinic acid, azelaic acid, fumaric acid, glutaric acid and malonic acid.

* * * * *

UNITED STATES PATENT AND TRADEMARK OFFICE
CERTIFICATE OF CORRECTION

| | | |
|---|---|---|
| PATENT NO. | : 7,785,500 B2 | Page 1 of 1 |
| APPLICATION NO. | : 12/092453 | |
| DATED | : August 31, 2010 | |
| INVENTOR(S) | : Atsushi Yamaguchi et al. | |

It is certified that error appears in the above-identified patent and that said Letters Patent is hereby corrected as shown below:

FRONT PAGE

In section (86), line 3, "(2), (4) Date: May 2, 2008" should read --(2), (4) Date: September 30, 2008--.

Signed and Sealed this
Twenty-fifth Day of January, 2011

David J. Kappos
*Director of the United States Patent and Trademark Office*